PHOTODIODE ASSEMBLY FOR OPTICAL ENCODER

Filed Jan. 18, 1968

Inventors
John Brean
Curt M. Lampkin
By: Burmeister, Kulie, Southard & Grdula
Attorneys United States Patent Office 3,522,435

Patented Aug. 4, 1970

3,522,435

PHOTODIODE ASSEMBLY FOR OPTICAL ENCODER

John Brean and Curt M. Lampkin, Cincinnati, Ohio, assignors to D. H. Baldwin Company, Cincinnati, Ohio, a corporation of Ohio Filed Jan. 18, 1968, Ser. No. 698,742
Int. Cl. H01l 15/06
U.S. Cl. 250—211 17 Claims

ABSTRACT OF THE DISCLOSURE

This application discloses a photovoltaic cell of low capacitance which responds rapidly to illumination. The photovoltaic cell here disclosed is one of small capacity and small sensitive area. The cell is formed by a slab of semiconductive material which has been doped with either donor or acceptor impurities. On one surface of the slab, a small region of semiconductor material doped oppositely from that of the slab is disposed forming a junction with the slab. The regions may be formed either by mounting a separate small chip of oppositely doped semiconducting material on the slab or by diffusing opposite impurities into the slab.

Electrical contact is provided to the slab and to the region of opposite impurity doping. The region of opposite impurity doping is provided with an electrical terminal in the form of a thin film of electrically conducting material which entirely surrounds the sensitive area of the region of opposite doping. The slab is mounted on an electrically insulating base which carries terminals electrically connected to the terminals of the slab. A layer of electrically insulating material extends across the surface of the slab remote from the terminals for the regions of opposite doping, and a layer in the form of an electrically conducting film is disposed on the layer of electrical insulating material. A plurality of regions of oppositely doped impurities are shown on a common cell to form an assembly of photocells, and each of the regions of opposite doping is disposed in a particular location, namely, equally spaced along a straight line.

A photocell assembly thus constructed has particular utility in a shaft angle optical encoder, and this application discloses an encoder utilizing such an assembly of photovoltaic cells.

The present invention relates generally to photovoltaic cells, and more particularly to an assembly of photovoltaic cells useful in a photoelectric analog to digital encoder.

It has long been known that a photodiode in the form of a p-n junction will generate an electrical potential across its terminals in response to irradiation provided the photodiode is not subjected to a bias potential. The book "Notes on Analog-Digital Conversion Techniques," edited by Alfred K. Susskind, the Technology Press of Massachusetts Institute of Technology, 1957, reported that such photovoltaic cells contain promise for use in analog to digital optical encoders. Time constants of the order of about 40 microseconds are there reported with silicon p-n junctions which have a spectral sensitivity peak in the near infra-red range, namely 0.8 micron. The sensitive areas of such cells were reported to be relatively large, namely from 0.1 to 10 square inches.

Silicon p-n junction diodes have been used in photoelectric shaft angle encoders, but their use has been limited by the relatively large capacity of the diode, the relatively low leakage resistance of the diode, and the relatively large sensitive areas of such cells. It is believed that the relatively low leakage resistance of the silicon diode cells known prior hereto is at least in part due to a ledge of damaged area surrounding the sensitive area of the cell which reduces the electrical output in response to irradiation and the electrical resistance of the cell. It is also believed that the low leakage resistance of such conventional silicon p-n junction cells is in part due to the large area of the junction thereof.

It is an object of the present invention to provide a photovoltaic cell which is provided with a substantially smaller sensitive area and a substantially smaller junction than the photovoltaic cells known heretofore. More specifically, it is an object of the present invention to provide an assembly of photovoltaic cells which is particularly adapted for use as a phototransducer in a direct reading shaft angle optical encoder.

Optical encoders may be either of the direct reading type in which the shaft angle is determined by sampling of a plurality of photocells which confront separate tracks of a code disc carried by the shaft, such as shown in U.S. Pat. No. 3,023,406, of Edward M. Jones, dated Feb. 27, 1962, entitled "Optical Encoder," or the incremental type in which rotation of a code disc with a single track confronting a single photocell generates pulses which are counted from an arbitrary zero position, such as disclosed in U.S. Pat. No. 3,058,001, of Michael L. Dertouzos, dated Oct. 9, 1962, entitled "Photoelectric Encoder." Silicon junction diodes have been used as photocells in incremental encoders prior to the present invention, since the size of a photocell is less significant in incremental encoders. However, the excessive size of silicon diode photocells has limited their use in direct reading photoelectric encoders prior to the present invention.

It is therefore an object of the present invention to provide a photoelectric shaft angle direct reading encoder utilizing an assembly of photovoltaic cells of smaller size than the photovoltaic cells known heretofore.

It is also an object of the present invention to provide an assembly of photovoltaic cells in which the sensitive areas of the cells are substantially smaller than photovoltaic cells known prior hereto, the capacity of the photovoltaic cells are substantially lower than photovoltaic cells known prior hereto, the electrical resistance of the photovoltaic cells is substantially greater than such cells exhibited prior hereto, and the time constant of the photovoltaic cells is substantially smaller than the photovoltaic cells known prior hereto.

These and further objects of the invention will be readily appreciated by those skilled in the art from a further consideration of this specification, particularly when viewed in the light of the drawings, in which.

Figures 1, 2, 3, 4, 5, 6, 7:
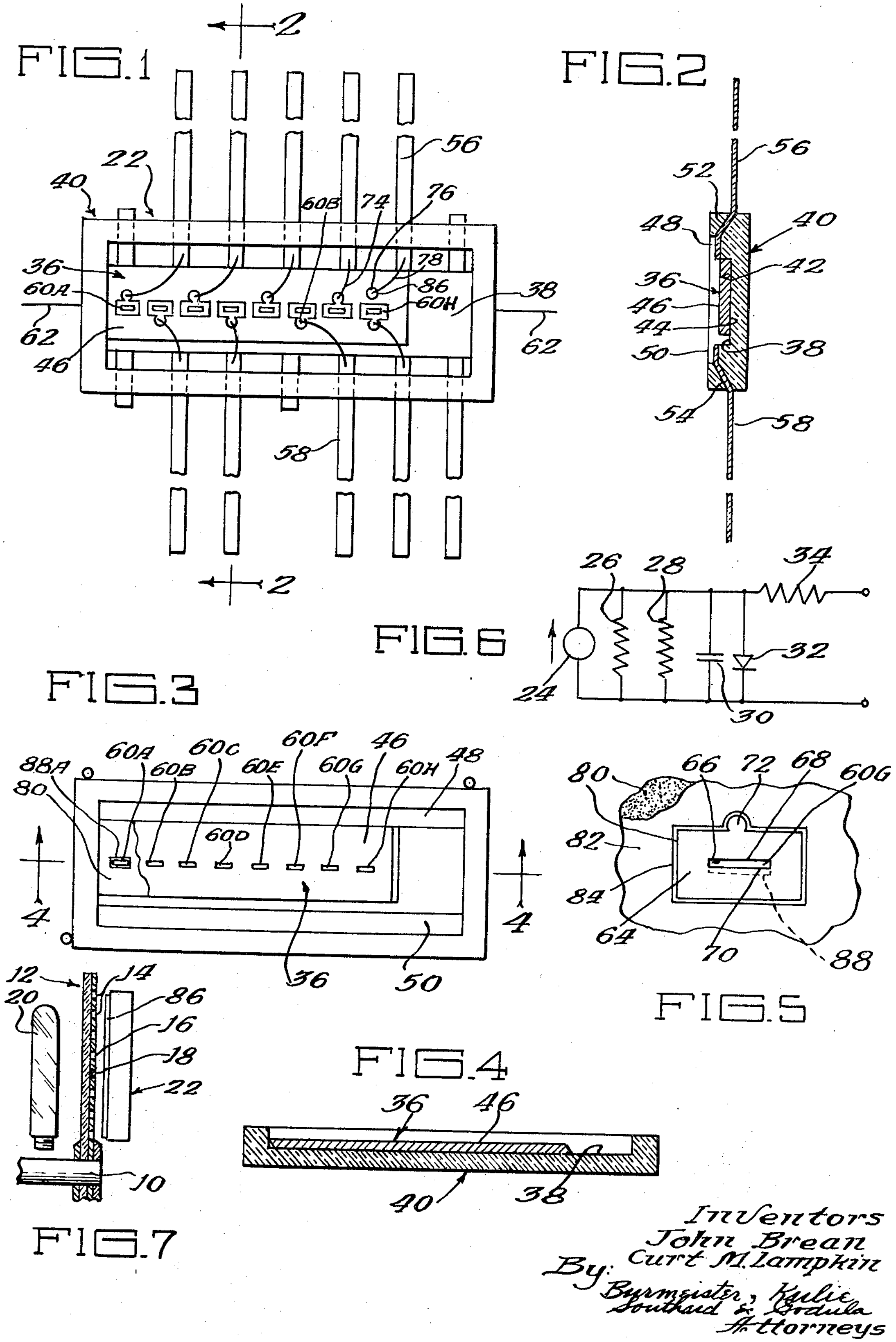
FIG. 1 is a plan view of a photovoltaic cell constructed according to the teachings of the present invention.
FIG. 2 is a sectional view taken along the line 2—2 of FIG. 1.
FIG. 3 is a plan view of the photocell assembly during the process of production.
FIG. 4 is a sectional view of the photocell assembly during the process of production taken along the line 4—4 of FIG. 3.
FIG. 5 is an enlarged fragmentary view of a portion of the photocell assembly during a further stage of production.
FIG. 6 is a schematic diagram of the equivalent electrical circuit of one photovoltaic cell.
FIG. 7 is a diagrammatic view, partly in section, of an analog to digital encoder constructed according to the teachings of the present invention.

An analog to digital encoder may be utilized to encode shaft angle positions from an arbitrary zero axis. FIG. 7 illustrates a shaft 10 whose rotational position is to be encoded. A code disc 12 is mechanically affixed to the shaft 10, and the code disc 12 has a plurality of tracks 14 which extend coaxially about the shaft 10 and contain transparent segments 16 spaced by opaque segments 18. A light source 20 is disposed on one side of the code disc 12, and a photocell is mounted on the other side of the code disc confronting each track, the photocells being in a common assembly 22 as illustrated in FIG. 7.

The encoder functions by virtue of the fact that the code disc 12 has a plurality of unique combination of opaque and transparent sectors disposed on spaced radii of the code disc. The code disc may thus be sampled or read along a radial fixed axis, called the read out axis, to determine the position of the code disc at the moment of sampling. In the particular illustration of FIG. 7, the read-out axis is the plane of the figure, since the light source 20 and photocell assembly 22 are disposed in this plane. The light source 20 may either be periodically actuated to produce an electrical output from each of the photocells of the photocell assembly 22, or the light source 20 may be continuous and the photocells themselves periodically actuated or sampled to produce an electrical signal at a given time interval. In accordance with the teachings of the present invention, each of the photocells is a photovoltaic cell, that is, a cell which produces a voltage output in response to irradiation from the light source 20.

A photovoltaic cell may be considered schematically as having a generator, indicated at 24 in FIG. 6, which produces a direct current potential across its terminals. Also, such a cell has a leakage resistance shown at 26 which limits the electrical output of the cell. In conventional photovoltaic cells, an additional resistance element designated 28 is in effect parallel with the leakage resistance 26, and this additional resistance element 28 is caused by damage resulting from the cutting of the peripheral edges of the cell during production. The additional resistance 28 is conventionally the largest portion of the leakage resistance of the cell, and often reduces the leakage resistance of conventional photovoltaic cells to the order of 50 ohms. In accordance with the present invention, the additional resistance indicated at 28 is substantially eliminated to reduce leakage and increase the leakage resistance to the order of at least 300,000 ohms.

A photovoltaic cell also has a capacitance indicated at 30 in FIG. 6. The two principal causes of capacitance in photovoltaic cells is the electrodes which abut the p-type material and n-type material of the semiconductor and the junction itself. In accordance with the present invention, the capacitance 30 is substantially reduced by reducing the area of the electrodes and the size of the junction. Since the capacitance is one of the elements determining the time constant of the photovoltaic cell, reducing the capacitance also reduces the time constant. Since a semiconductor photovoltaic cell is also a diode, the diode is indicated at 32, and a series resistance is indicated at 34 in FIG. 6.

FIGS. 1, 2 and 5 best illustrate the photocell assembly 22. A slab 36 of semiconductive material, such as silicon, which is quadrangular in form is mounted in a rectangular shaped recess 38 and a base 40. The base 40 is constructed of electrically insulating material, such as glass, or other material of low electrical conductivity. The base 40 is also quadrangular in form and has a major axis which generally coincides with the major axis of the slab 36. The base 40 has a flat surface 42 which is engaged by a flat undersurface 44 of the slab 36, and the two surfaces 42 and 44 are secured together by a layer of cement. The slab 36 also has a surface 46 parallel to the surface 44, and it is the surface 46 which confronts the code disc 12. The base 40 also has recesses 48 and 50 disposed at opposite sides of the major axis of the base 40, and a plurality of spaced slots 52 extend through the base 40 to the recess 48. In like manner, a plurality of slots 54 extend through the base 40 from the edges thereof to the recess 50. As illustrated in FIGS. 1 and 2, each of the slots 48 contains an electrically conducting strip 56, and each of the slots 54 contains an electrically conducting strip 58. The strips 56 and 58 form the electrical terminals for the photocells of the photovoltaic cell assembly.

The slab 36 is cut from a single crystal of a material suitable for forming a semiconductor, such as silicon. It also has been doped with impurities to provide an acceptor or a donor region, and throughout this specification, it will be assumed that the slab 36 has been doped with n-type impurities and that a plurality of p-type impurity regions are disposed on the surface 46 confronting the code disc 12, although it is to be understood that the slab 36 may be doped with p-type impurities and the plurality of regions on the surface 46 may be doped with n-type impurities. FIG. 3 shows a plurality of regions doped with p-type impurities on the surface 46 of the slab 36, the regions being designated 60A, 60B, 60C, 60D, 60E, 60F, 60G, and 60H. Each of these regions may be formed by bonding or otherwise affixing a small chip of silicon doped with p-type impurities on the surface 46, but the regions 60A through 60H are preferably formed by diffusing p-type impurities directly into the surface 46 of the slab 36. The regions 60A through 60H are all disposed upon a common axis, designated 62 in FIG. 1, and this axis 62 is aligned with the read-out axis of the code disc 12 and the axis of the light source 20. Further, the regions 60A through 60H are spaced at distances equal to the spacing between tracks 14 of the code disc 12, so that one of the regions directly confronts each of the tracks of the code disc 12.

As best illustrated in FIG. 5, each of the regions 60A through 60H is surrounded by a rectangularly shaped layer 64 of electrically conducting material. The layer 64 partially overlaps the region of p-type material to form an electrical contact therewith. Further, the layer 64 has in effect a window 66 which confronts the area of p-type material and forms a pair of parallel edges 68 and 70 which restrict the sensitive area of the photovoltaic cell formed by the region of p-type material disposed on the n-type slab 36, since the layer 64 shields the edges of the sensitive area from impinging light. It is desirable that the electrically conducting layer 64 be as small as possible however in order to reduce the capacitance of each of the photocells, and therefore, the layer 64 is intentionally made too small to conveniently connect electrical conductors. An outwardly protruding tab 72 is provided from one side of the layer 64 to permit electrical and mechanical connection of a wire 74 which will extend to one of the electrically conducting strips 56.

A small circular island 76 of electrically conducting material is also provided on the surface 36 and spaced from the electrically conducting layer 64. The island 76 forms a terminal for a wire 78 to form an electrical connection between the n-type base 36 and one of the strips 56.

The entire surface 46 of the base 36, with the exceptions of the portion of the surface covered by the island 76, and at least part of the layers 64, is covered by a layer 80 of electrically insulating material. It is to be noted that the layer 80 even covers the sensitive regions 60A through 60H, but must be transparent to impinging illumination. When utilizing a silicon slab 36, the layer 80 is preferably of silicon oxide. A third layer of electrically conducting material 82 is disposed on the layer 80 of electrically insulating material about the first layers 64 and the island 76 in order to protect the photovoltaic cells from stray fields and from atmospheric attack, and to shield inactive areas from illumination. The third layer 82 is spaced from each of the first layers 64 by a gap designated 84 in order to electrically insulate the first layers 64. In like manner, a gap 86 is provided about the island 76. The layer 80 of electrically insulating material physically spaces the third electrically conducting layer 82 from the surface 46 of the slab 36 to reduce the capacitance of the photovoltaic cells.

The art is fully aware of suitable impurities for doping slabs of semiconducting material and also fully aware of the doping material necessary to produce n-type and p-type material. Reference is made to "Silicon Semiconductor Technology" by W. R. Runyan, McGraw-Hill Book Company, 1965, for such information. For purposes of this specification, silicon may be doped with Ag, As, Au, Fe, Li, Mn, P, Sb, and S, to produce donor material. In like manner, silicon may be doped with Al, B, Ga, In, and Zn to produce acceptor material.

A photocell assembly constructed according to the teachings of the present invention may most readily be constructed by first mounting the strips 56 and 58 on the base 40 and cementing the strips or otherwise securing them in place. Thereafter, the slab 36 may be mounted on the base 40 with the surface 46 facing away from the base 40. It is preferable to diffuse n-type impurities into the slab 36 before the slab 36 is mounted on the base 40. The entire surface 46 is exposed to an oxygen atmosphere to provide a layer of silicon oxide thereon. A layer of resist, not shown, may then be placed over the base 40 and surface 46 of the slab 36 to provide exposed areas to form the regions 60A, 60B, 60C, 60D, 60E, 60F, 60G, and 60H. These exposed areas are then subjected to etching to expose essentially identical areas on the surface 46 of the slab 36. P-type impurities are then diffused into these exposed areas to form the regions 60A, 60B, 60C, 60D, 60E, 60F, 60G, and 60H. Thereafter the resist is removed, and the entire surface is again exposed to an oxygen atmosphere to provide a uniform layer of silicon oxide over the entire surface 46. A layer of resist is then applied to the layer of silicon oxide on the surface 46 to mask the entire surface except for a portion of each of the regions 60A, 60B, 60C, 60D, 60E, 60F, 60G, and 60H, and the small region of the surface adjacent to each of these regions. The exposed portion for each region may be in the form of a narrow slit, illustrated at 88 in FIG. 5, or it may be in the form of a rectangular frame completely surrounding the sensitive region and overlapping it as shown at 88A in FIG. 3. A window is also provided at this time for the island 76. The exposed window for the island and narrow slits or frames are then subjected to etching to remove the layer 80 of insulating material from the slits or frames and the island area. A layer of electrically conducting material, such as aluminum, is then applied to the exposed slits or frames and island and the resist that is covering the surface. Thereafter, the layer of resist is removed and a new layer of resist applied having openings corresponding to the island and layers 64 surrounding the regions is then applied, this layer also covering the windows 66. An electrically conducting layer is then deposited on the exposed areas to form the layers 64, which thus overlap the narrow slits or frames 88A to form electrical contact with the p-type material. The island 76 is also formed at this time. The resist is then removed, and a mask having openings conforming in shape to the layers 64 and island 76, but of greater size, is then placed over the slab 36 and a further layer of resist is applied through the openings thereof. Thereafter the mask is removed and the exposed portions of the layer 80 of electrically insulating material is then coated with the layer 82 of electrically conducting material. It is then only necessary to connect each wire 74 between a tab 72 of the photocells and one of the strips 56 and 58, as indicated in FIG. 1.

In a preferred construction of an encoder according to the present invention, the electrically conducting layers 64 have dimensions of approximately .014 inch by .025 inch, and are separated from the layer 82 by a gap of approximately 0.0005 inch. The tab 72 has a circular periphery with a diameter of approximately 0.003 inch and extends approximately 0.002 inch from the body of the layer 64. Each slot or window 66 in the layer 64 has a width between the edges 68 and 70 of approximately 0.001 inch and a length of approximately 0.012 inch. As thus constructed, each of the photovoltaic cells has a capacity of approximately 17 micro-micro-farads or less, substantially lower than the capacity of prior art silicon cells.

While it is generally desirable that the area of the window 66 in the electrically conducting layer 64 approximate the area and width of the transparent sectors of the code disc 12, it is possible to utilize larger windows 66 than the area of the transparent sectors of the code disc 12. The use of a slit plate or a cylindrical lens, designated 86 in FIG. 7, effectively demagnifies the area of the windows 66 to provide the desired resolution.

A photocell assembly may also be constructed according to the teachings of the present invention by means of an etching process. It is generally more convenient to fully process the slab 36 prior to mounting the slab 36 on the base 40. The slab 36 consists of a single crystal of semiconductor material which has been provided with a thin layer of an impurity producing one type of semiconductor material immediately adjacent to the surface 46 thereof, and also contains a region immediately inwardly from this layer of semiconductive material containing an impurity of the other type. For example, the surface layer of the slab 36 may have diffused therein a p-type impurity and the immediately inward region of the slab 36 may have diffused therein an n-type material.

A mask with windows conforming to the regions 60A, 60B, 60C, 60D, 60E, 60F, 60G, and 60H is then placed on the surface 46 of the slab 36, and regions of resist are placed on the surface 46 through the windows of the mask. The surface 46 of the slab is then etched to remove the thin layer of a p-type material and to expose the layer of n-type material immediately thereunder. A mask is then placed over the surface 46 to apply a layer of resist through a window which corresponds to the island 76. The slab 36 is then subjected to an oxygen atmosphere to provide a layer of silicon oxide over the entire surface thereof including the exposed edges of the regions 60A, 60B, 60C, 60D, 60E, 60F, 60G, and 60H.

The layers of resist are then removed from the regions 60A, 60B, 60C, 60D, 60E, 60F, 60G, and 60H, and the island 76, and a mask is positioned on the surface 46 which has a window aligned with and corresponding to the island 76 and a window confronting a portion of each of the regions 60A through 60H, either in the form of the narrow slit 88 of FIG. 5 or the rectangular frame 88A of FIG. 3, however, if the rectangular frame is utilized, the major portions of the regions 60A through 60H must be masked. A layer of electrically conducting material, such as aluminum, is then deposited on the island 76 and the exposed regions within the windows confronting the regions 60A through 60H.

Thereafter, a mask having windows corresponding to the regions 60A through 60H and island 76, but of larger dimensions, is positioned on the surface 46 in alignment with the regions and island. A layer of resist is thereupon placed over the exposed areas, and the mask removed. A layer of electrically conducting material is thereupon deposited on the surface 46 covering the entire surface. The layers of resist are then removed from the regions 62A through 62H and island 76.

The strips 56 and 58 are first affixed on the base, 40 and then the slab 36 as prepared above is mounted on the base 40 with the surface 46 remote from the base 40. The electrical wires 74 are then connected between the strips 56 and 58 and the conducting frames 88A or strips 88 affixed to the regions 60A through 60H, and the wire 78 is connected between the island 76 and the strip 56 therefor. The wires 74 and 76 may be electrically connected as specified above by ultrasonic bonding. Thereafter, the slab 36 and base 40 are subjected to an oxygen atmosphere to provide a layer of silicon oxide over all exposed surfaces.

Those skilled in the art will readily appreciate many modified constructions of the present invention and many utilities of the present invention beyond that here set forth. It is therefore intended that the scope of the present invention be not limited by the foregoing disclosure, but rather only by the appended claims.

The invention claimed is:

1. A position responsive analog to digital encoder comprising, in combination: a code member adapted to be moved responsive to the positional changes to be encoded having a plurality of tracks of transparent sectors separated by opaque sectors, each said tracks being normal to a common read-out line in the plane of the member disposed in a fixed position relative to the code member; a light source disposed on one side of the code member confronting the read-out line; and an assembly of photo diodes confronting the read-out line on the other side of the code member having a base of electrically insulating material, a slab consisting of a single crystal of semiconductor material mounted on the base having a surface confronting the code member, said slab being doped with an impurity of a first type changing the relative number of current carriers in the semiconductive slab, said slab also having a plurality of discrete regions on the surface thereof disposed at spaced intervals confronting the read-out line of the code member doped with an impurity of a second type, one of said type of impurities producing donor semiconductive material and the other type of impurities producing acceptor semiconductive material, each of the regions doped with an impurity of the second type confronting a different track of the code member, and a plurality of electrodes mounted on the slab, one of the electrodes being electrically connected to a portion of the slab doped with impurities of the first type and different other electrodes being electrically insulated from said one electrode and electrically connected to each of the regions doped with the second type of impurities.

2. A position responsive analog to digital encoder comprising the combination of claim 1 wherein the impurity in the plurality of regions on the surface of the slab is diffused into the slab.

3. A position responsive analog to digital encoder comprising the combination of claim 1 wherein the dimension of each of the plurality of regions on the surface of the slab measured normal to the axis of the plurality of regions is approximately equal to the width of the smallest transparent sector of the track of the code member confronting each said region measured normal to the read-out line.

4. A position responsive analog to digital encoder comprising the combination of claim 1 wherein a layer of electrically conducting material surrounds and makes electrical contact with each region on the surface of the slab and forms the electrode for said region.

5. A position responsive analog to digital encoder comprising the combination of claim 4 wherein a second layer of electrically insulating material is disposed on the surface of the slab entirely surrounding each of the first layers of electrically conducting material, and a third layer of electrically conducting material is disposed on the second layer, said third layer entirely surrounding and being spaced from each of the first layers.

6. A position responsive analog to digital encoder comprising the combination of claim 5 wherein the slab consists of silicon and the second layer comprises silicon oxide.

7. A position responsive analog to digital encoder comprising the combination of claim 5 wherein the first layer has a generally rectangular perimeter and is provided with an outwardly extending tab therefrom.

8. A photocell assembly comprising, in combination: a base of electrically insulating material, a slab consisting of a single crystal of semiconductor material mounted on the base having a surface opposite the base, said slab being doped with an impurity of a first type changing the relative number of current carriers in the semiconductive slab, said slab also having a plurality of discrete regions on the surface thereof disposed at spaced intervals doped with an impurity of a second type, one of said type of impurities producing donor semiconductive material and the other type of impurities producing acceptor semiconductive material, and a plurality of electrodes mounted on the slab, one of the electrodes being electrically connected to a portion of the slab doped with impurities of the first type and different other electrodes being electrically connected to each of the regions doped with the second type of impurities.

9. A photocell assembly comprising the combination of claim 8 wherein the impurity in the plurality of regions on the surface of the slab is diffused into the slab.

10. A photocell assembly comprising the combination of claim 8 wherein a layer of electrically conducting material surrounds and makes electrical contact with each region on the surface of the slab and forms an electrode for said region.

11. A photocell assembly comprising the combination of claim 10 wherein a second layer of electrically insulating material is disposed on the surface of the slab entirely surrounding each of the first layers of electrically conducting material, and a third layer of electrically conducting material is disposed on the second layer, said third layer surrounding and being spaced from each of the first layers.

12. A photocell assembly comprising the combination of claim 11 wherein the slab consists of silicon and the second layer comprises silicon oxide.

13. A photocell assembly comprising the combination of claim 11 wherein the first layer has a generally rectangular perimeter and is provided with an outwardly extending tab therefrom.

14. A photocell assembly comprising, in combination: a base of electrically insulating material, a slab consisting of a single crystal of semiconductor material mounted on the base having a surface opposite the base, said slab being doped with an impurity of a first type changing the relative number of current carriers in the semiconductive slab, said slab also having a plurality of regions on the surface thereof disposed at spaced intervals doped with an impurity of a second type, one of said type of impurities producing donor semiconductive material and the other type of impurities producing acceptor semiconductive material, a plurality of electrodes mounted on the slab, one of the electrodes being electrically connected to a portion of the slab doped with impurities of the first type and different other electrodes being electrically connected to each of the regions doped with the second type of impurities wherein the base has an indentation therein of greater depth than the thickness of the slab and the slab is disposed within the indentation, said base also having a recess extending therein on one side of the indentation and a plurality of slots extending through the base from the recess and away from the indentation, an electrically conducting strip disposed in each slot and mounted on the base, each of said strips protruding into the recess and extending from the base at the end of its slot opposite the recess, and an electrically conducting wire electrically connected between each electrode and a different electrically conducting strip.

15. A photocell assembly comprising the combination of claim 8 wherein an island of electrically conducting material is disposed on the slab remote from the regions on the surface of the slab, a second layer of electrically insulating material is disposed on the surface of the slab entirely surrounding the island of electrically conducting material, and a third layer of electrically conducting material is disposed on the second layer, said third layer surrounding and being spaced from the island.

16. A photocell assembly comprising, in combination: a base of electrically insulating material, a slab consisting of a single crystal of semiconductor material mounted on the base having a surface opposite the base, said slab being doped with an impurity of a first type changing the relative number of current carriers in the semiconductive slab, said slab also having a plurality of regions on the surface thereof disposed at spaced intervals doped with an impurity of a second type, one of said type of impurities producing donor semiconductive material and the other type of impurities producing acceptor semiconductive material, a plurality of electrodes mounted on the slab, each electrode being disposed on one of the regions doped with the second type of impurities and having a window to radiation therein.

17. A photocell assembly comprising the combination of claim 16 wherein the electrode comprises a film of electrically conducting material and the window is disposed centrally within the film.

References Cited

UNITED STATES PATENTS

| | | | |
|---|---|---|---|
| 2,941,088 | 6/1960 | Mahaney | 250—211 |
| 3,020,412 | 2/1962 | Byczkowski | 250—211 |
| 3,344,278 | 9/1967 | Yanai | 250—211 |

RALPH G. NILSON, Primary Examiner

M. ABRAMSON, Assistant Examiner

U.S. Cl. X.R.

250—231; 317—235